United States Patent [19]

Maschmann et al.

[11] Patent Number: 5,465,074
[45] Date of Patent: Nov. 7, 1995

[54] AMPLIFIER OUTPUT STAGE

[75] Inventors: Martin Maschmann, Duisburg; Werner Schardein, Kamp-Lintfort; Bedrich Hosticka, Duisberg, all of Germany

[73] Assignees: Fraunhofer-Gesellschaft zur Foerderung der angewandten Forschung e.v.; Siemens Aktiengesellschaft, both of Munich, Germany

[21] Appl. No.: 261,441

[22] Filed: Jun. 17, 1994

[30] Foreign Application Priority Data

Jun. 17, 1993 [DE] Germany ............ 43 20 061.3

[51] Int. Cl.$^6$ ........................................ H03F 3/26
[52] U.S. Cl. ............ 330/263; 330/264; 330/265
[58] Field of Search ........................ 330/263, 264, 330/265, 310, 311

[56] References Cited

U.S. PATENT DOCUMENTS

| | | | |
|---|---|---|---|
| 3,895,306 | 7/1975 | Rebeles | 330/262 |
| 4,112,386 | 9/1978 | Everhart et al. | 330/265 |
| 4,959,623 | 9/1990 | Khoury | 330/265 |
| 5,162,753 | 11/1992 | Khorramabadi | 330/264 |
| 5,317,254 | 5/1994 | Olson | 330/265 X |
| 5,351,012 | 9/1994 | Toumazou | 330/265 X |

FOREIGN PATENT DOCUMENTS

| | | |
|---|---|---|
| 2738817 | 8/1979 | Germany . |
| 62-147802 | 1/1987 | Japan . |

*Primary Examiner*—Steven Mottola
*Attorney, Agent, or Firm*—Hill, Steadman & Simpson

[57] ABSTRACT

An amplifier output stage that can be operated with low supply voltages and has a voltage amplification greater than one has two complementary transconductance amplifiers having asymmetrical characteristics of their output currents with reference to the input voltages. The amplifier output stage also has two power amplifiers following these transconductance amplifiers and whose outputs are connected to the output node of the amplifier output stage. The amplifier output stage also has a feedback network that is connected between the output node and a reference potential node and defines a feedback node that is connected to respectively one of the inputs of the transconductance amplifiers, whereas the other inputs of the transconductance amplifiers are connected to the input node of the amplifier output stage.

14 Claims, 8 Drawing Sheets

5,465,074

AMPLIFIER OUTPUT STAGE

BACKGROUND OF THE INVENTION

The present invention is directed to an amplifier output stage.

In particular, the present invention is concerned with a low-impedance output stage for an amplifier that can be operated with low supply voltages and enables a voltage amplification greater than one.

Typically, what are referred to as class AB push-pull output stages are employed for driving high capacitative and resistive loads given high supply voltages. Such a class AB push-pull output stage has the typical circuit structure shown in FIG. 1 with five transistors T1 through T5 and a current source IO. The output stage shown in FIG. 1 maximally reaches an output level that extends up to the sum of a base-emitter voltage and a collector-emitter saturation voltage at the positive or, respectively, negative supply voltage VDD, VSS. The typical operative range of such class AB push-pull output stages for supply voltages above five volts derives therefrom. The output stage according to FIG. 1 is completely unsuitable for supply voltages of approximately 2 volts and below, since the possible output level control or modulation only amounts to a maximum of 100 through 200 mV proceeding from the center potential.

Given low supply voltages of approximately 2 V, circuit principles are therefore utilized as shown in FIG. 2. A differential amplifier DIFF generates drive voltages for two bipolar transistors T6, T7 of the output side that are operated in emitter circuitry. The output is fedback onto the inverting input of the differential amplifier DIFF via two resistors R2, R1.

A corresponding circuit structure can also be implemented with MOS transistors of the output side.

The output voltage of this output stage shown in FIG. 2 reaches the supply level VDD, VSS except for an emitter-collector saturation voltage, so that the output voltage is higher by a base-emitter voltage than the output voltage of the output stage shown in FIG. 1.

Since the collectors of the output transistors T6, T7 form the output of this stage, the stage is high-impedance. Given voltage changes at the output, for example due to external causes, this means that only a minimum current change ensues due to the output transistors T6, T7. The output transistors T6, T7 can thus not compensate voltage changes caused by external causes by themselves, as the transistors T4 and T5 in FIG. 1 can on the basis of the emitter negative feedback. The current through the output transistors can only change due to the feedback of the output voltages via the resistors R2, R1 onto the inverting input of the differential amplifier DIFF. Given a voltage change at the inverting input of the differential amplifier due to a voltage change at the output, the drive voltage for the output transistors and, thus, the current through the output therefore change. The level of the reaction of the differential amplifier to an undesired change of the output voltage is dependent on the divisor factor TL that is defined by the values of resistance of the negative feedback resistors R1, R2. The following is valid: TL=R1/(R1+R2)). The level of the reaction is also dependent on the gain of the differential amplifier. The reaction to the changes of the output voltage is all the greater and the output stage is all the lower in impedance the greater the gain and the greater the divisor factor TL.

Due to the frequency-dependency of the gain of the differential amplifier DIFF (decrease of the gain toward high frequencies), the output impedance of the circuit shown in FIG. 2 increases with increasing frequencies. The bandwidth of this known output stage is limited due to the phase shift of the differential amplifier DIFF that drives the output stage transistors T6, T7, this phase shift increasing at high frequencies.

SUMMARY OF THE INVENTION

It is an object of the present invention to provide an amplifier output stage that can be operated with low supply voltage and that nonetheless has a low frequency-dependency of the output impedance and has a high bandwidth.

This object is achieved by an amplifier output stage having the following elements. Two complementary amplifiers with asymmetrical characteristic, two power amplifiers with inputs connected to the outputs of the amplifiers and outputs connected to the output node of the amplifier output stage. A feedback network is connected between the output node and a reference potential node and defines a feedback node. A respective input of the amplifiers is connected to the input nodes of the amplifier output stage and the respectively other input of the amplifiers is connected to the feedback node. The two complementary amplifiers are complementary transconductance amplifiers each having respectively two inputs and one output that each respectively have an asymmetrical characteristic of their output current relative to the voltage pending at their inputs given opposite directions of current flow of their output currents. The output current of the one transconductance amplifier has only positive values and increases with increasing positive input voltage, and has a positive value at the input voltage of zero and decreases with increasing negative input voltage. The output current of the other transconductance amplifier has only negative values and increases with increasing negative input voltage, and has a negative value given the input voltage of zero and decreases with increasing positive input voltage.

Advantageous developments of the present invention are as follows.

Each of the transconductance amplifiers has the following features. A first transistor has a base connected to the input node, a collector connected to a supply potential node and an emitter connected to an internal node. A first current source is connected to the internal node. A second transistor has an emitter connected to the internal node, a base connected to the feedback node and a collector connected to the input of the power amplifier.

Alternatively, each transconductance amplifier has the following features. A first transistor has a gate connected to the input node, a drain connected to a supply potential node and a source connected to an internal node. A first current source is connected to the internal node. A second transistor has a source connected to the internal node, a gate connected to the feedback node and a drain connected to the input of the current amplifier.

The feedback network is formed by an ohmic voltage divider whose divider node forms the feedback node. A compensation capacitor is connected parallel to one of the resistors of the voltage divider between the feedback node and the output node. The voltage divider defines a divisor factor that is greater than 5.

The power amplifier has at least one first current mirror circuit. An emitter follower circuit is connected to the input of the first current mirror circuit such that the base-emitter voltage of transistors of the input side of the first current mirror circuit is downwardly limited. A second current source is connected to the output of the transconductance amplifiers. The second current source is formed by a circuit arrangement whose structure corresponds to that of the transconductance amplifier, of the emitter follower circuit and of the first current mirror circuit, whereby the nodes of this circuit arrangement that correspond to the input node and to the feedback node are applied to reference potential.

BRIEF DESCRIPTION OF THE DRAWINGS

The features of the present invention which are believed to be novel, are set forth with particularity in the appended claims. The invention, together with further objects and advantages, may best be understood by reference to the following description taken in conjunction with the accompanying drawings, in the several Figures of which like reference numerals identify like elements, and in which:

DESCRIPTION OF THE PREFERRED EMBODIMENT

Figure 3:
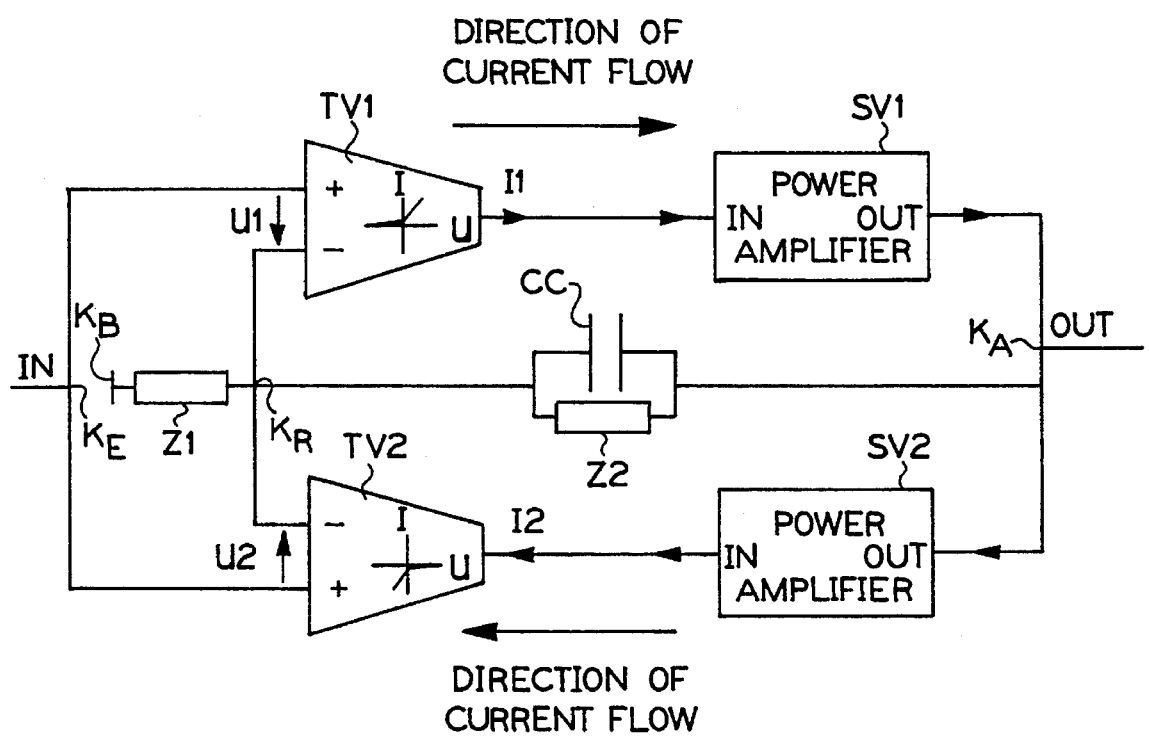
FIG. 3 depicts a first exemplary embodiment of the amplifier output stage of the present invention.

FIG. 3 shows the basic structure of the amplifier output stage of the present invention. The amplifier output stage V shown therein has two complementary transconductance amplifiers TV1, TV2 each having respectively two inputs and one output, these respectively having an asymmetrical characteristic of their output current relative to the voltage pending at their inputs given opposite directions of current flow of their output currents I1, I2. The output current I1 of the first transconductance amplifier TV1 increases with increasing positive input voltage u1, has a positive value at the input voltage u1 having the value 0, and decreases with increasing negative input voltage, whereby, however, a positive current differing from 0 is also impressed into the output given the exemplary embodiment shown here within the input voltage operating range of the circuit even given maximum negative input voltage u1. At the second transconductance amplifier TV1 executed complementary relative to the first transconductance amplifier TV1, the characteristic of the output current I2 has such a curve related to the input voltage u2 that the output current I2 of the second transconductance amplifier TV2 increases with increasing negative input voltage, has a negative value at the input voltage with the value 0, and decreases with increasing positive input voltage. However, an output current I2 that still differs from 0 is always impressed into the output here, too.

The amplifier output stage V1 further has two power amplifiers SV1, SV2 whose inputs are connected to the output of the two transconductance amplifiers TV1, TV2 and whose outputs are connected to the output node $K_A$ of the amplifier stage V. A feedback network Z1, Z2, CC is connected between the output node $K_A$ and a reference potential node $K_B$, whereby the reference potential node $K_B$ lies at grounded potential given the exemplary embodiment shown here. The feedback network defines a feedback node $K_R$ that is connected to the two inverting inputs of the transconductance amplifiers TV1, TV2. The respective positive or, respectively, non-inverting input of the transconductance amplifiers TV1, TV2 is connected to an input node $K_E$ of the amplifier output stage to which the input voltage signal $U_c$, defined relative to grounded potential can be applied.

Figure 1:
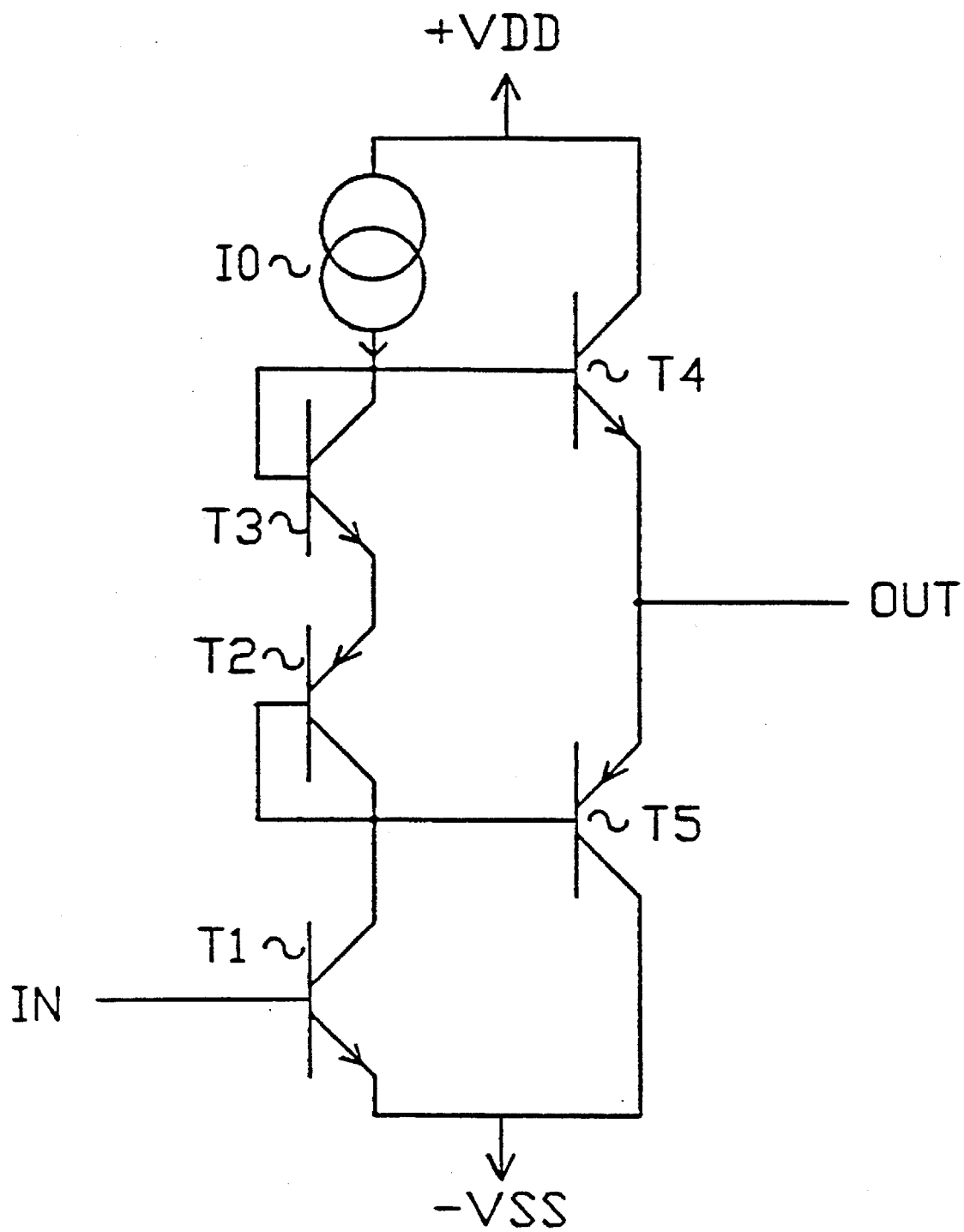
FIG. 1 depicts a known class AB push-pull output stage.
Figure 2:
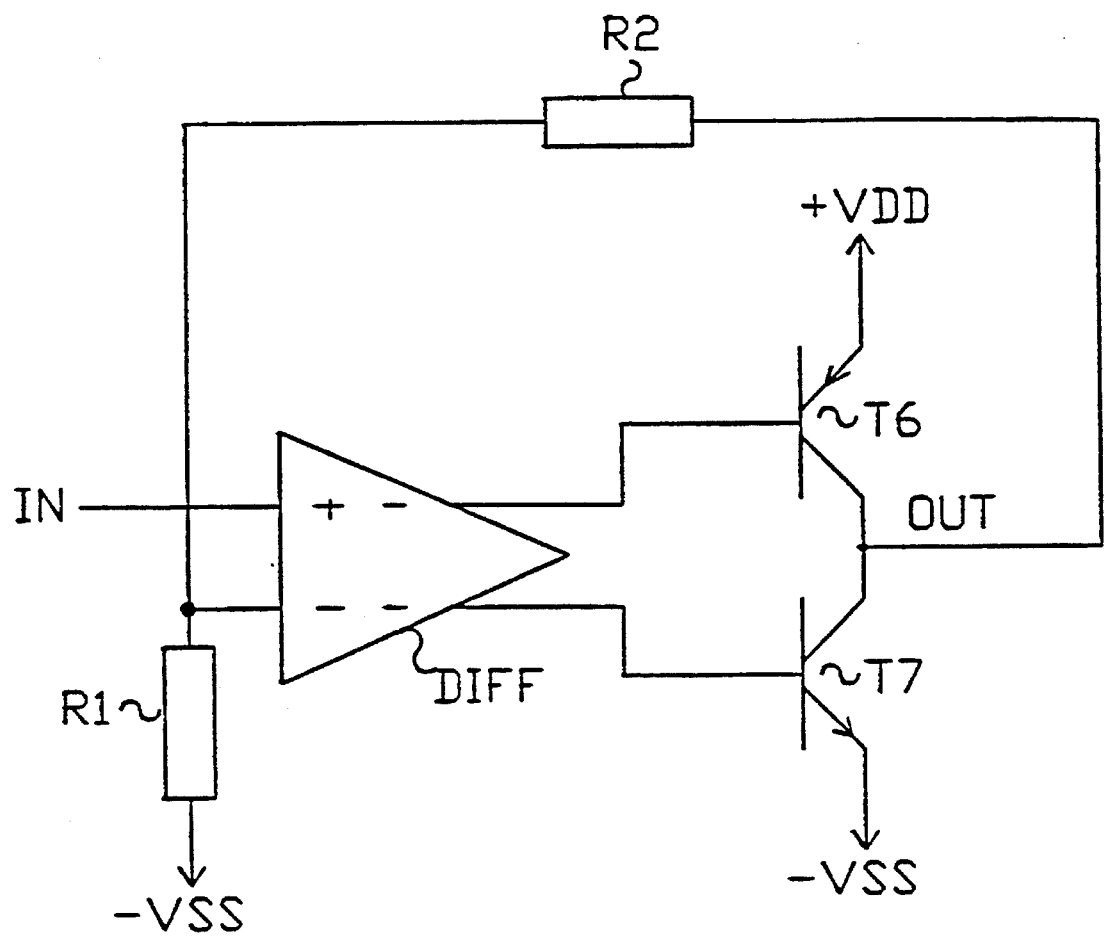
FIG. 2 depicts a known output stage for a low supply voltage level.

The inventive amplifier output stage V1, whose basic structure is shown in FIG. 3 in the form of an exemplary embodiment, makes it possible to keep the output impedance of the amplifier output stage low without having to use the feedback over the entire amplifier, as is the case given the circuit of FIG. 2. By contrast to the stage of FIG. 2, a voltage drive of output transistors is foregone in the amplifier output stage V of the invention, so that a high bandwidth of the amplifier output stage of the invention is achieved.

The transconductance amplifiers TV1, TV2 employed in the amplifier output stage of the invention can be very simply executed since they need not satisfy any special linearity demands.

In the following explanation of further exemplary embodiments of the amplifier output stages of the invention, coinciding reference characters shall be employed for coinciding circuit components. Insofar as nothing to the contrary is stated, these circuit components are interconnected to one another in the way already defined.

Figure 4:
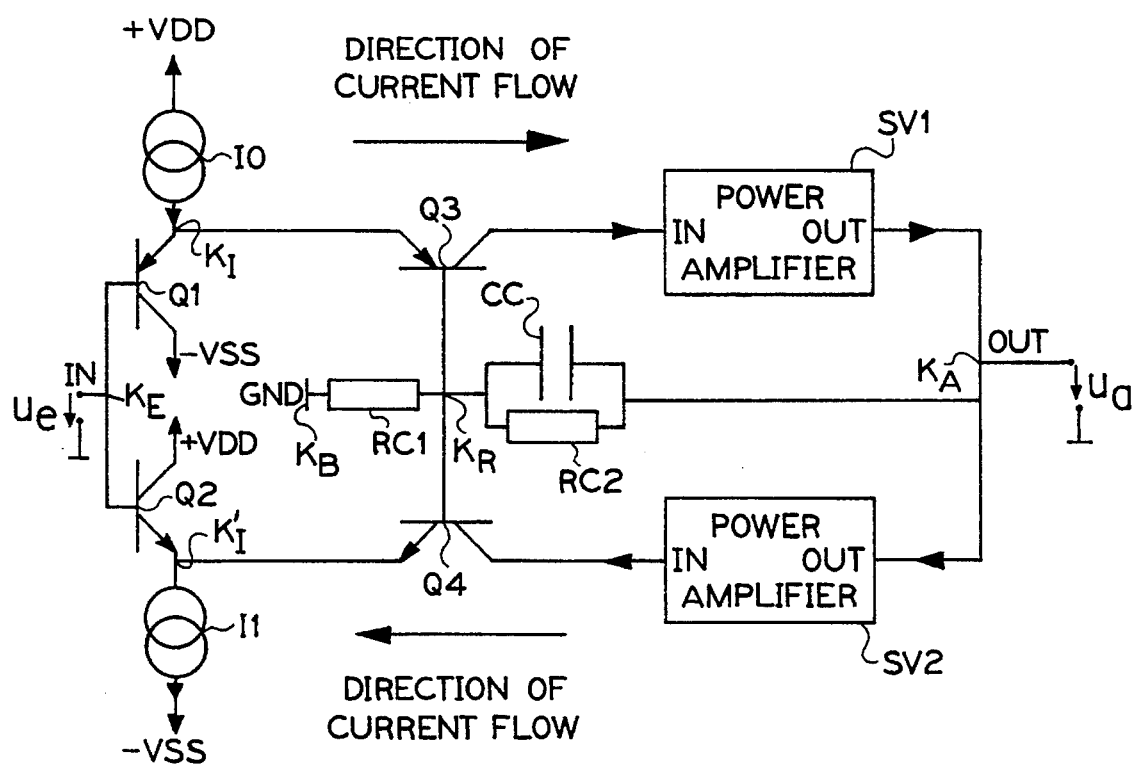
FIG. 4 depicts a second exemplary embodiment of the amplifier output stage of the present invention.

As shown in FIG. 4, each of the transconductance amplifiers TV1, TV2 can be formed by a first transistor Q1, Q2, by a second transistor Q3, Q4 and by a first current source I0, I1. In both transconductance amplifiers TV1, TV2, the respectively first transistor Q1, Q2 has its base connected to the input node $K_E$, has its collector connected to the supply potential VSS, VDD, and has its emitter connected to an internal circuit node $K_I$, $K'_I$. The first current source I0, I1 lies between the internal nodes $K_I$, $K'_I$ and one of the two supply potentials VDD, VSS. The second transistor Q3, Q4 has its emitter connected to the internal nodes $K_I$, $K'_I$, has its base connected to the feedback node $K_R$ and has its collector connected to the input of the power amplifier SV1, SV2. The feedback network here is realized by two ohmic resistors RC1, RC2. As shall be explained in detail later, a compensation capacitor CC lies parallel to the resistor RC2 that is connected between the feedback node $K_R$ and the output node $K_A$.

The functioning of the inventive amplifier output stage 4 shown in FIG. 4 can be explained on the basis of the following consideration:

Proceeding from the quiescent point, which corresponds to the grounded potential, the input voltage $U_c$ is raised. As a result thereof, the base-emitter voltage of the transistor Q3 rises and, thus, the collector current through this transistor Q3 rises. This rising current is amplified by the power amplifier SV1 and is transmitted to the output $K_A$ where it effects a voltage rise at a load of the output side that, for example, can be formed by the parallel circuit of a load resistor $R_L$ and a load capacitor $C_L$. This voltage rise is reduced by the voltage divider RC1, RC2 and is supplied to the base of the transistor Q3, as a result whereof the base-emitter voltage of this transistor Q3 is reduced and the current rise is consequently limited by this transistor Q3 as soon as the output voltage has reached p-times the input voltage, whereby the following is valid: T=(RC1+RC2)/RC1.

At the transistor Q4, the base-emitter voltage reduces given increase of the input voltage $U_c$, so that less current is transmitted to the power amplifier SV2 belonging to this transistor Q4, as a result whereof it likewise increases the output voltage. Since the base-emitter voltage at this transistor Q4 rises again due to the rise of the output voltage, the current through this transistor Q4 is not abruptly disconnected but is disconnected only relatively late and proceeding comparatively softly, as can be easily shown in terms of equations.

Since the base-emitter diodes of the transistors Q1, Q2, Q3 and Q4 shown here form a closed loop, $I_C$, Q1·$I_C$, Q2=$I_C$, Q3·$I_C$ Q4 is thus valid for the base current thereof and, thus, for the collector currents thereof as well. The product $I_C$, Q1·$I_C$, Q2 is kept nearly constant by the current sources I0, I1, so that the product $I_C$, Q3·$I_C$, Q4 is also constant in a first approximation. The cut-off characteristic of the transistors Q3, Q4 of the output stage is thus such that given doubling of the current flow in the one-half of the stage this is halved in the other half. The undesired, complete shut-off of one-half of the amplifier output stage, as required in the explanation of the amplifiers TV1 and TV2 in FIG. 3, is thus not possible. This stage therefore exhibits behavior similar to the known class AB push-pull output stage wherein distortions at the zero-axis crossing of the input signal are avoided in that both output transistors are kept conductive at the point in time of the zero-axis crossing.

The following considerations document the low-impedance of the output $K_A$ of the amplifier output stage V of the present invention. Let it be assumed that the output voltage rises due to a cause of an unknown type. Via the voltage dividers RC1, RC2, this leads to a rise at the feedback node $K_R$ and, thus, to a reduction of the base-emitter voltage at the transistor Q3 and to a rise of the base-emitter voltage at the transistor Q4. The current through Q4 rises, is transmitted to the output amplifier and effects a reduction of the output voltage.

The compensation of the stage ensues via the divider resistors RC1, RC2 and via the compensation capacitor CC. Given high-frequency output signals, the capacitor CC shorts the resistor RC2, so that the output signal is coupled fully into the base of the transistors Q3, Q4 and thus opposes oscillations.

The inventive amplifier output stage is functional down to a supply voltage of 2 V, for example, plus/minus 1 V referred to ground. At such supply levels, it is viewed with preference to operate the stage with a high divisor factor T. The following is valid for the divisor factor: T=(RC1+RC2)/RC1. The divisor factor T is identical to the voltage amplification of the output stage which is greater than 1. At such supply levels, a divisor factor of approximately 10 is considered preferred, since the input of the output stage is already over-driven at small voltage boosts of more than 0.2 V and a high voltage amplification T is to be set for achieving a high level control or modulation at the output.

Figure 5:
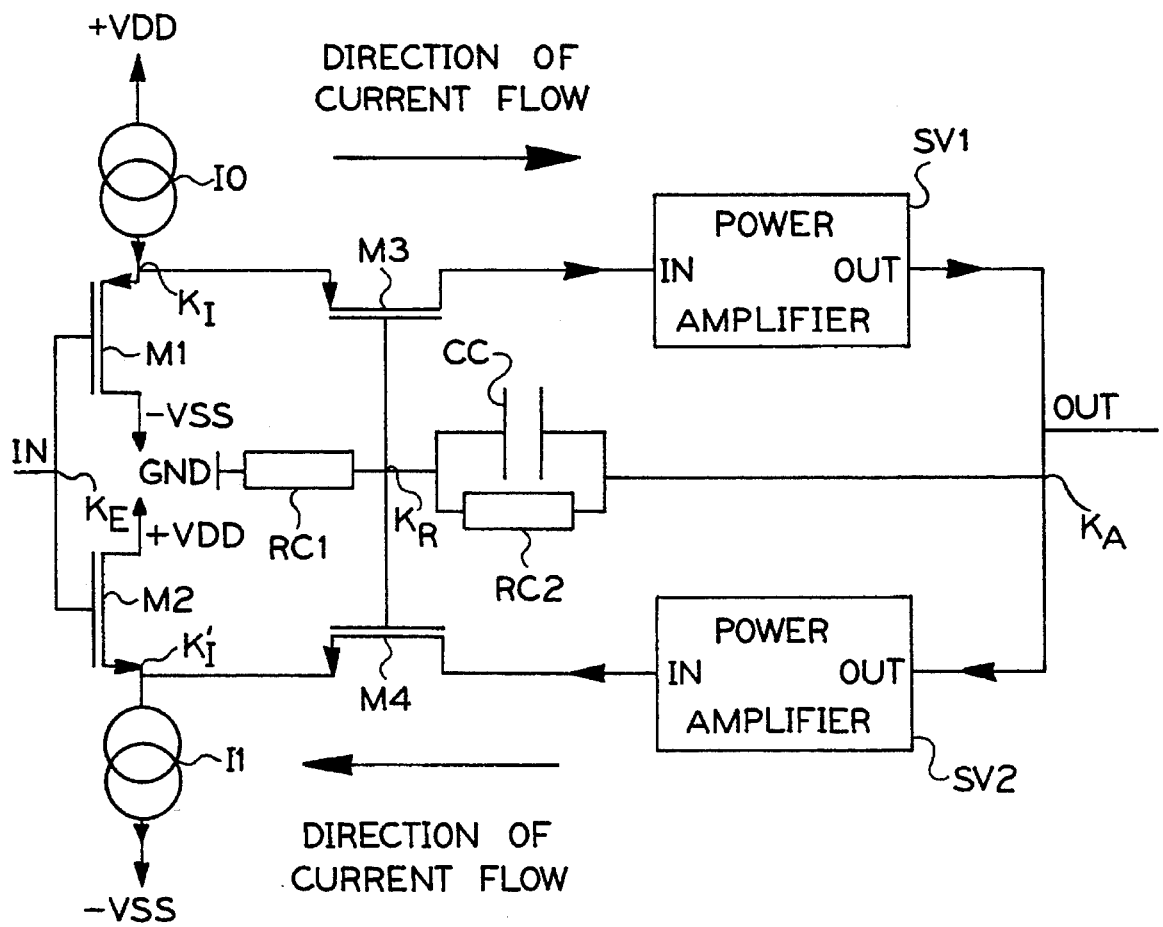
FIG. 5 depicts a third exemplary embodiment of the amplifier output stage of the present invention.

As shown in FIG. 5, the circuit of FIG. 4 can also be constructed in MOS technology. In this case, the first transistors M1, M2 have their gates connected to the input node $K_E$, have their drain connected to the reference potential node and have their source connected to the internal nodes $K_I$, $K'_I$.

In this case, the second transistors M3, M4 have their source connected to the internal nodes $K_I$, $K'_I$, have their gate connected to the feedback node $K_R$ and have their drain connected to the input of the power amplifier SV1, SV2.

The function of the amplifier stage in MOS technology shown in FIG. 5 is in fact poorer than that of the amplifier stage in bipolar technology shown in FIG. 4 but is nonetheless better than the function of comparable output stages of the prior art. Due to the lower rate of rise of the MOS transistors M1 through M4, the voltage difference between the input node $K_E$ and the output node $K_A$ is greater than in the bipolar version of FIG. 4 since the gate-source paths of these transistors M1 through M4 fluctuate more greatly than the base-emitter paths in the bipolar version. As a result thereof, the voltage amplification of the stage decreases and is more poorly defined. The MOS version according to FIG. 5 is therefore better-suited for somewhat higher supply voltages than the bipolar version according to FIG. 4. The transistors M1 through M5 should be operated with high W/1 ratios, for example, close to or in what is referred to as the sub-threshold range. Since the transistors then become extremely large, the MOS version is poorly suited for the high currents of the bipolar version, so that the MOS version should be operated with lower currents.

In general, the inventive structure of the amplifier output stage reduces the outlay for the design of a lower-impedance output stage, enhances the bandwidth thereof and effects that the output impedance thereof becomes more independent of frequency in the operating frequency range. The inventive amplifier output stage is suitable for driving high resistive and capacitative loads without stability problems arising. The input impedance of the amplifier output stage of the invention is in fact higher than the input impedance of the output stage transistors of the circuit according to FIG. 2 but is lower than the input impedance of the overall stage of FIG. 2. The amplifier output stage of the invention can be implanted with a voltage amplification greater than 1. The voltage amplification can be set in the limits between 2 and 10 on the basis of a suitable selection of the feedback resistors RC1, RC2.

Figure 6:
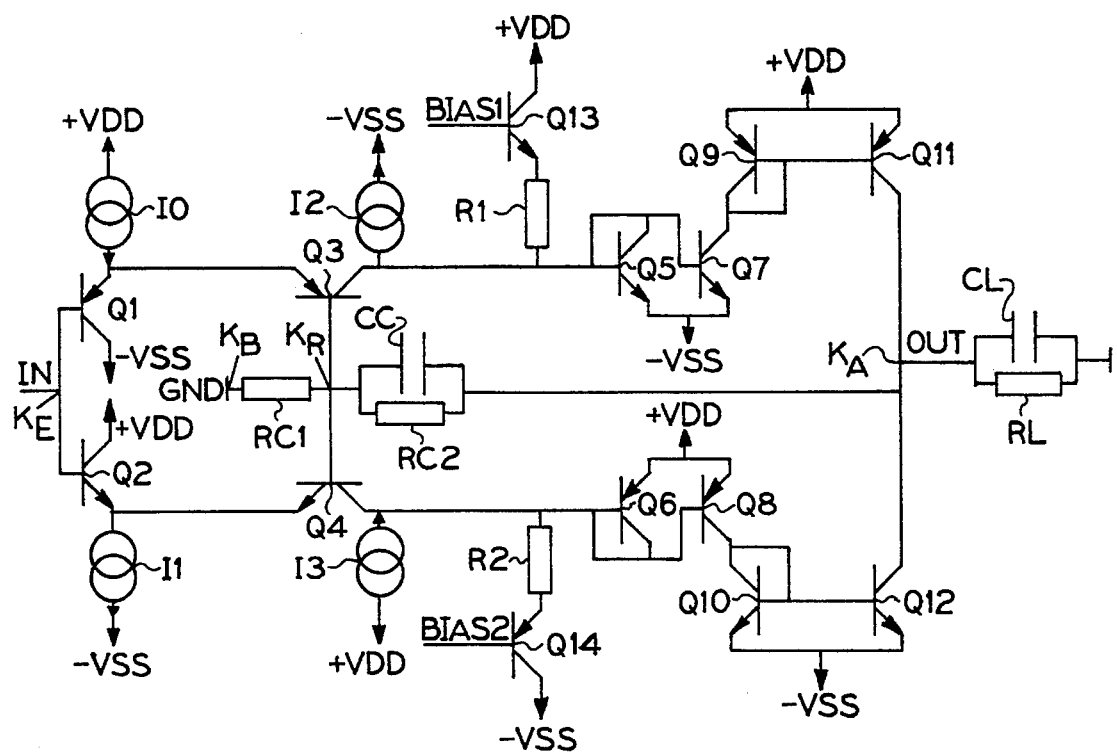
FIG. 6 depicts a fourth exemplary embodiment of the amplifier output stage of the present invention.

The exemplary embodiment shown in FIG. 6 differs from the structure of the amplifier output stage of FIG. 4 on three points.

First, the power amplifiers SV1, SV2 here are formed by a third through sixth transistor Q5, Q7, Q9, Q11; Q6, Q8, Q10, Q12 that are connected as a current mirror. The gain of the current mirrors Q5, Q7, Q9, Q11; Q6, Q8, Q10, Q12 in the illustrated exemplary embodiment amounts to 200. Transistors in MOS technology can be employed instead of bipolar transistors herewith without limitations.

In a further departure from the embodiment of FIG. 4, two further components have been integrated into the power amplifiers, namely, first, the second current sources I2, I3 and, second, the emitter follower circuits Q13, R1; Q14, R2.

Due to the second current sources I2, I3, which impress approximately identical currents, the excess current is carried off through the second transistors Q3, Q4. This measures reduces the quiescent current of the output stage that would otherwise be too high given high current amplifications in power amplifiers SV1 and SV2. Due to the introduction of these second current sources I2, I3, it is possible and desirable to completely shut off one-half of the output stage, with reference to the symmetry axis, given high output level controls or modulations. This means that either the transistor Q5 or the transistor Q6 shuts off.

Upon re-activation, the base voltage of these transistors must first rise to a value or approximately 0.6 through 0.8 V; this can last relatively long.

To this end, the emitter follower circuits Q13, R1; Q14,

R2 are provided which limit the absolute values of the base-emitter voltages of the transistors Q5 and Q6 in downward direction to 0.5 through 0.6 dependent on the value of the biases BIAS1, BIAS2. A complete shut-off of one stage half is avoided in this way. The transistors Q13, Q14 can likewise be replaced by MOS transistors since, given a bipolar embodiment of these transistors, it is required anyway to reduce their steepness with emitter resistors.

Figure 7:
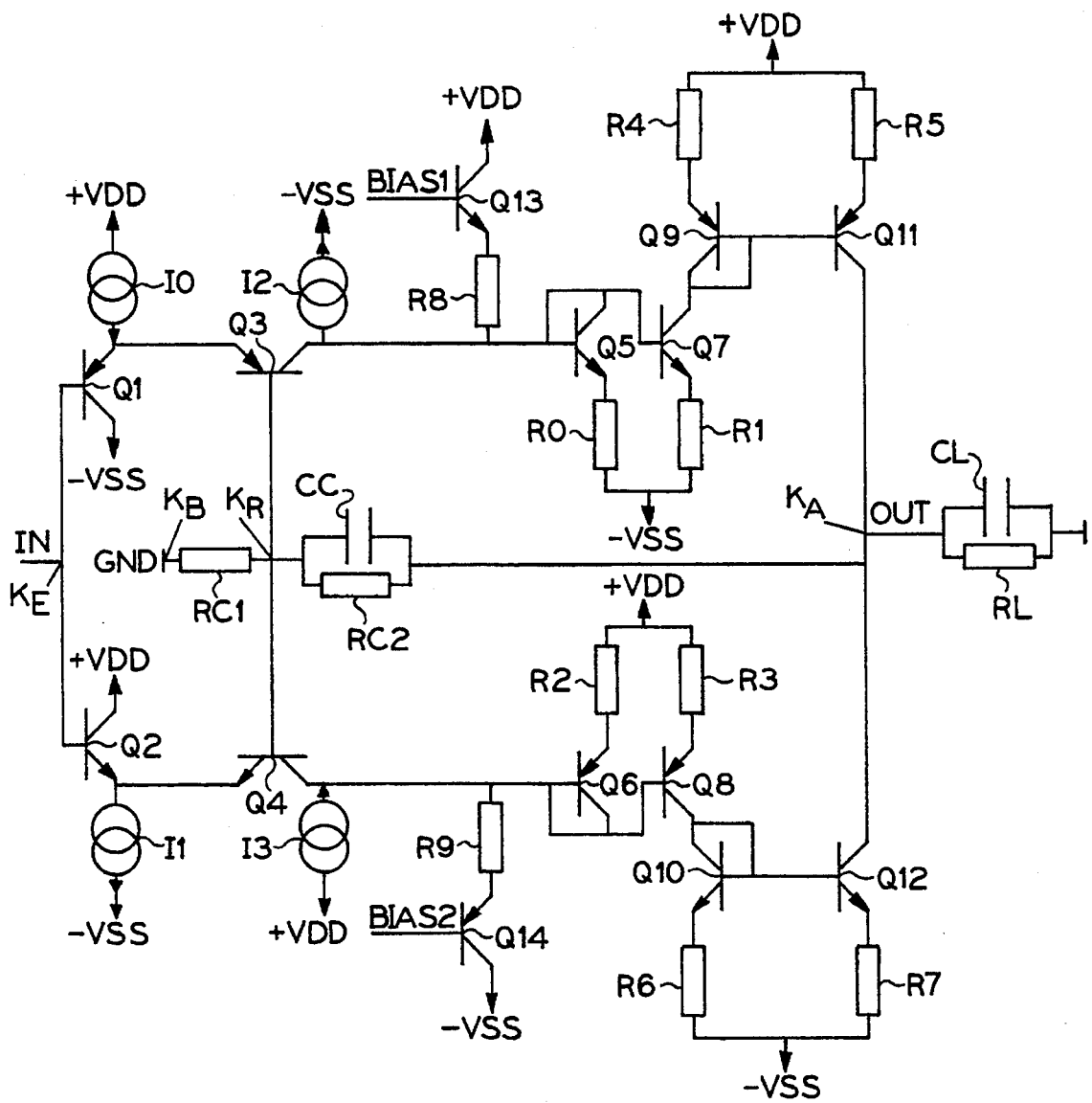
FIG. 7 depicts a fifth exemplary embodiment of the amplifier output stage of the present invention.

The further embodiment of the inventive amplifier stage shown in FIG. 7 differs from the embodiment of FIG. 6 in that the logarithmic current mirrors Q5, Q7, R0, R1; Q9, Q11, R4, R5; Q6, Q8, R2, R3; Q10, Q12, R6, R7 are utilized here for the reduction of the overall quiescent current. In comparison to the circuit of FIG. 6, the emitters of the bipolar transistors here are respectively connected to the reference potentials VDD, VSS via resistors. The symmetrically arranged resistors R0, R2; R1, R3; R4, R6; R5, R7 respectively have essentially coinciding values. When the values of resistance of R0 is greater than that of R1, and the value of resistance of R4 is greater than that of R5, the current gain is low for small output currents and is high for great output currents, so that the quiescent current is substantially less amplified by the transistors Q3 and Q4, as a result whereof a further decrease of the quiescent current is achieved. At low currents, the relationships of the mirror areas of the transistors define the mirror ratio, whereas the resistors define the mirror ratio given high currents.

Figure 8:
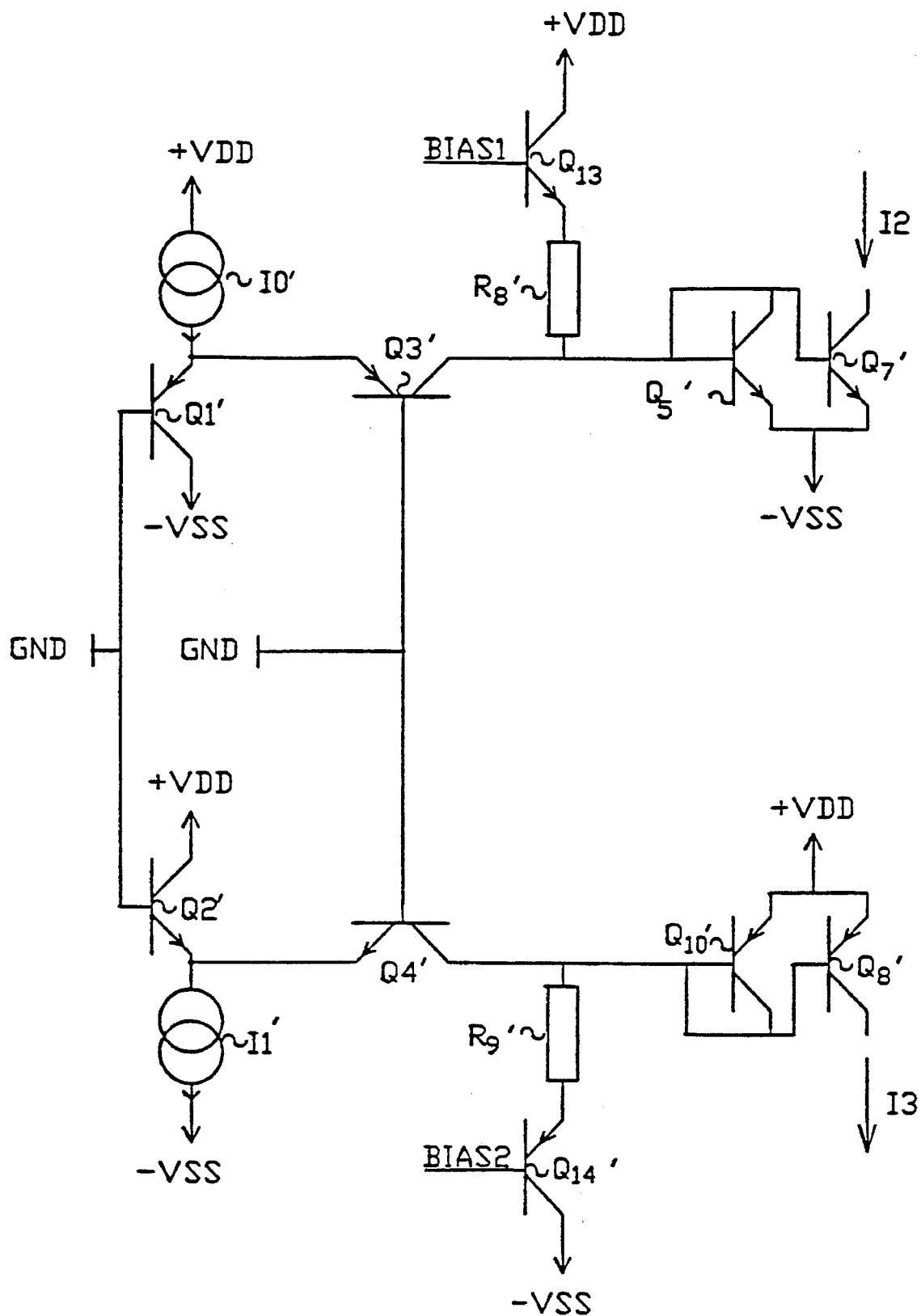
FIG. 8 depicts an embodiment of a power supply circuit for the exemplary embodiments of the amplifier output stage of the invention shown in FIGS. 6 and 7.

FIG. 8 shows a further output sub-stage that serves the purpose of generating the currents I2, I3 in, for example, the embodiment of the amplifier output stage of FIG. 6 and, with the exception of the current sources I2, I3 shown therein, has all elements that the circuit according to FIG. 6 comprises between the input node $K_E$ and the collectors of the transistors Q7, Q8. The output sub-stage according to FIG. 8 is paired with the output stage of FIG. 6. Coinciding circuit elements are referenced with coinciding reference characters that, however, are provided with an "prime" in the output sub-stage of FIG. 8. When, due to the paired embodiment of the elements and due to design-wise measures, the transistors Q1, Q1', Q2, Q2', Q3, Q3', Q4, Q4' and the current sources I0, I0' as well as I1, I1' are tightly thermally coupled, then the drift of the quiescent current can be largely compensated.

In the quiescent current compensation circuit according to FIG. 8 for generating the currents I2, I3, however, let it be pointed out that those nodes corresponding to the input node $K_E$ and the feedback node $K_R$ in the amplifier output stage V of FIG. 6 are applied to reference potential or, respectively, ground.

The invention is not limited to the particular details of the apparatus depicted and other modifications and applications are contemplated. Certain other changes may be made in the above described apparatus without departing from the true spirit and scope of the invention herein involved. It is intended, therefore, that the subject matter in the above depiction shall be interpreted as illustrative and not in a limiting sense.

What is claimed is:

1. An amplifier output stage, comprising:

first and second complementary amplifiers with asymmetrical characteristics and having inputs and outputs;

first and second power amplifiers having inputs respectively connected to the outputs of the first and second complementary amplifiers and having outputs connected to an output node of the amplifier output stage;

a feedback network connected between the output node and a reference potential node, the feedback network being formed by an ohmic divider having a divider node that defines a feedback node;

a respective first input of the first and second complementary amplifiers connected to an input node of the amplifier output stage and a respective second input of the first and second complementary amplifiers connected to the feedback node;

the first and second complementary amplifiers being complementary transconductance amplifiers each having first and second inputs and said output and having an asymmetrical characteristic of their output current relative to the voltage pending at their inputs given opposite directions of current flow of their output currents;

the output current of one transconductance amplifier of the first and second complementary amplifiers having only positive values and increasing with increasing positive input voltage, and having a positive value for an input voltage of zero and decreasing with increasing negative input-voltage;

the output current of the other transconductance amplifier of the first and second complementary amplifiers having only negative values and increasing with increasing negative input voltage, and having a negative value for an input voltage of zero and decreasing with increasing positive input voltage; and a compensation capacitor connected in parallel to one of the resistors of the voltage divider between the feedback node and the output node.

2. An amplifier output stage, comprising:

first and second complementary amplifiers with asymmetrical characteristics and having inputs and outputs;

first and second power amplifiers having inputs respectively connected to the outputs of the first and second complementary amplifiers and having outputs connected to an output node of the amplifier output stage, each of the first and second power amplifiers having at least a first current mirror circuit;

a feedback network connected between the output node and a reference potential node, the feedback network defining a feedback node;

a respective first input of the first and second complementary amplifiers connected to an input node of the amplifier output stage and a respective second input of the first and second complementary amplifiers connected to the feedback node;

the first and second complementary amplifiers being complementary transconductance amplifiers each having first and second inputs and said output and having an asymmetrical characteristic of their output current relative to the voltage pending at their inputs given opposite directions of current flow of their output currents;

the output current of one transconductance amplifier of the first and second complementary amplifiers having only positive values and increasing with increasing positive input voltage, and having a positive value for an input voltage of zero and decreasing with increasing negative input voltage;

the output current of the other transconductance amplifier of the first and second complementary amplifiers having only negative values and increasing with increasing negative input voltage, and having a negative value for an input voltage of zero and decreasing with increasing positive input voltage; and an emitter follower circuit connected to an input of the first current mirror circuit such that a base-emitter voltage of transistors of an input side of the first current mirror circuit is downwardly limited.

3. An amplifier output stage, comprising:

first and second complementary amplifiers with asymmetrical characteristics and having inputs and outputs;

first and second power amplifiers having inputs respectively connected to the outputs of the first and second complementary amplifiers and having outputs connected to an output node of the amplifier output stage, each of the first and second power amplifiers having at least a first current mirror circuit;

a feedback network connected between the output node and a reference potential node, the feedback network defining a feedback node;

a respective first input of the first and second complementary amplifiers connected to an input node of the amplifier output stage and a respective second input of the first and second complementary amplifiers connected to the feedback node;

the first and second complementary amplifiers being complementary transconductance amplifiers each having first and second inputs and said output and having an asymmetrical characteristic of their output current relative to the voltage pending at their inputs given opposite directions of current flow of their output currents;

the output current of one transconductance amplifier of the first and second complementary amplifiers having only positive values and increasing with increasing positive input voltage, and having a positive value for an input voltage of zero and decreasing with increasing negative input voltage;

the output current of the other transconductance amplifier of the first and second complementary amplifiers having only negative values and increasing with increasing negative input voltage, and having a negative value for an input voltage of zero and decreasing with increasing positive input voltage a second current source connected to a respective output of a respective transconductance amplifier.

4. The amplifier output stage according to claim 3, wherein the second current source having a circuit arrangement corresponding to that of a transconductance amplifier connected to an emitter follower circuit that is connected to the first current mirror circuit, nodes of said circuit arrangement that correspond to the input node and to the feedback node being applied to reference potential.

5. An amplifier output stage, comprising:

first and second complementary amplifiers with asymmetrical characteristics and having inputs and outputs;

first and second power amplifiers having inputs respectively connected to the outputs of the first and second complementary amplifiers and having outputs connected to an output node of the amplifier output stage;

a feedback network connected between the output node and a reference potential node, the feedback network defining a feedback node;

a respective first input of the first and second complementary amplifiers connected to an input node of the amplifier output stage and a respective second input of the first and second complementary amplifiers connected to the feedback node;

the first and second complementary amplifiers being complementary transconductance amplifiers each having first and second inputs and said output and having an asymmetrical characteristic of their output current relative to the voltage pending at their inputs given opposite directions of current flow of their output currents;

the output current of one transconductance amplifier of the first and second complementary amplifiers having only positive values and increasing with increasing positive input voltage, and having a positive value for an input voltage of zero and decreasing with increasing negative input voltage;

the output current of the other transconductance amplifier of the first and second complementary amplifiers having only negative values and increasing with increasing negative input voltage, and having a negative value for an input voltage of zero and decreasing with increasing positive input voltage;

each of the first and second complementary amplifiers having a first transistor with a base thereof connected to the input node, with a collector thereof connected to a supply potential node and an emitter thereof connected to an internal node, having a first current source connected to the internal node, and having a second transistor with an emitter thereof connected to the internal node, with a base thereof connected to the feedback node and with a collector thereof connected to the input of a respective power amplifier.

6. The amplifier output stage according to claim 5, wherein each of the first and second power amplifiers comprises at least a first current mirror circuit.

7. The amplifier output stage according to claim 6, wherein an emitter follower circuit is connected to an input of the first current mirror circuit such that a base-emitter voltage of transistors of an input side of the first current mirror circuit is downwardly limited.

8. The amplifier output stage according to claim 6, wherein a second current source is connected to a respective output of a respective transconductance amplifier.

9. The amplifier output stage according to claim 8, wherein the second current source having a circuit arrangement corresponding to that of a transconductance amplifier connected to an emitter follower circuit that is connected to the first current mirror circuit, nodes of said circuit arrangement that correspond to the input node and to the feedback node being applied to reference potential.

10. An amplifier output stage, comprising:

first and second complementary amplifiers with asymmetrical characteristics and having inputs and outputs;

first and second power amplifiers having inputs respectively connected to the outputs of the first and second complementary amplifiers and having outputs connected to an output node of the amplifier output stage;

a feedback network connected between the output node and a reference potential node, the feedback network defining a feedback node;

a respective first input of the first and second complementary amplifiers connected to an input node of the amplifier output stage and a respective second input of the first and second complementary amplifiers connected to the feedback node;

the first and second complementary amplifiers being complementary transconductance amplifiers each having first and second inputs and said output and having an asymmetrical characteristic of their output current relative to the voltage pending at their inputs given opposite directions of current flow of their output currents;

the output current of one transconductance amplifier of the first and second complementary amplifiers having only positive values and increasing with increasing positive input voltage, and having a positive value for an input voltage of zero and decreasing with increasing negative input voltage;

the output current of the other transconductance amplifier of the first and second complementary amplifiers having only negative values and increasing with increasing negative input voltage, and having a negative value for an input voltage of zero and decreasing with increasing positive input voltage;

each of the first and second complementary amplifiers having a first transistor with a gate thereof connected to the input node, with a drain thereof connected to a supply potential node and with a source thereof connected to an internal node, having a first current source connected to the internal node, and having a second transistor with a source thereof connected to the internal node, with a gate thereof connected to the feedback node and with a drain thereof connected to the input of a respective power amplifier.

11. The amplifier output stage according to claim 10, wherein each of the first and second power amplifiers comprises at least a first current mirror circuit.

12. The amplifier output stage according to claim 11, wherein an emitter follower circuit is connected to an input of the first current mirror circuit such that a base-emitter voltage of transistors of an input side of the first current mirror circuit is downwardly limited.

13. The amplifier output stage according to claim 11, wherein a second current source is connected to a respective output of a respective transconductance amplifier.

14. The amplifier output stage according to claim 13, wherein the second current source having a circuit arrangement corresponding to that of a transconductance amplifier connected to an emitter follower circuit that is connected to the first current mirror circuit, nodes of said circuit arrangement that correspond to the input node and to the feedback node being applied to reference potential.

* * * * *